United States Patent
Komatsu et al.

(10) Patent No.: US 7,972,764 B2
(45) Date of Patent: *Jul. 5, 2011

(54) ELECTRON BEAM WRITING METHOD, FINE PATTERN WRITING SYSTEM, METHOD FOR MANUFACTURING UNEVEN PATTERN CARRYING SUBSTRATE, AND METHOD FOR MANUFACTURING MAGNETIC DISK MEDIUM

(75) Inventors: Kazunori Komatsu, Odawara (JP); Toshihiro Usa, Odawara (JP)

(73) Assignee: Fujifilm Corporation, Tokyo (JP)

( * ) Notice: Subject to any disclaimer, the term of this patent is extended or adjusted under 35 U.S.C. 154(b) by 352 days.

This patent is subject to a terminal disclaimer.

(21) Appl. No.: 12/277,627

(22) Filed: Nov. 25, 2008

(65) Prior Publication Data

US 2009/0140163 A1   Jun. 4, 2009

(30) Foreign Application Priority Data

Nov. 29, 2007   (JP) ................................. 2007-308367

(51) Int. Cl.
*G03C 5/00*   (2006.01)

(52) U.S. Cl. ........ 430/296; 430/942; 360/135; 369/101; 369/126

(58) Field of Classification Search .................. 430/296, 430/942; 360/135; 369/101, 126
See application file for complete search history.

(56) References Cited

U.S. PATENT DOCUMENTS 7,026,098 B2 *   4/2006   Komatsu et al. ............... 430/296
2005/0185562 A1 *   8/2005   Chauhan et al. ............... 369/101

FOREIGN PATENT DOCUMENTS

JP   2006-184924   7/2006

* cited by examiner

*Primary Examiner* — Christopher G Young
(74) *Attorney, Agent, or Firm* — Young & Thompson

(57) ABSTRACT

When writing elements of a fine pattern on a substrate applied with a resist by scanning an electron beam on the substrate, the electron beam is scan controlled so as to completely fill the shape of each of the elements by vibrating the electron beam rapidly in a radius direction of the rotation stage and at the same time deflecting in a direction orthogonal to the radius direction of the rotation stage faster than a rotational speed thereof, thereby sequentially writing the elements.

14 Claims, 6 Drawing Sheets

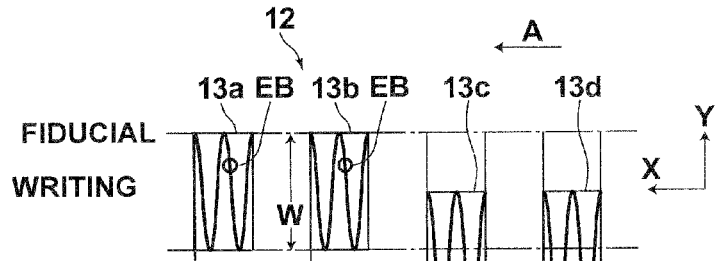
FIG.4A FIDUCIAL WRITING
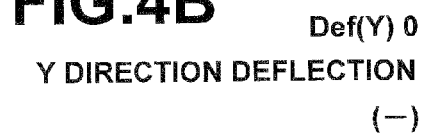
FIG.4B Def(Y) 0
Y DIRECTION DEFLECTION
(−)
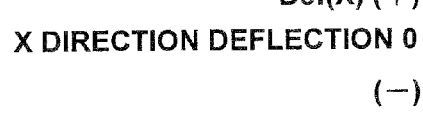
FIG.4C Def(X) (+)
X DIRECTION DEFLECTION 0
(−)
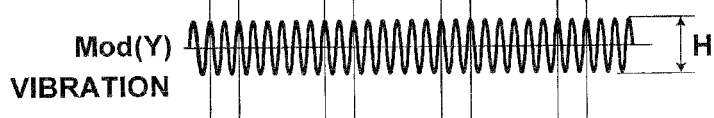
FIG.4D Mod(Y) VIBRATION
FIG.4E BLK ON/OFF
FIG.4F WRITING CLOCK SIGNAL
FIG.4G BASIC CLOCK SIGNAL

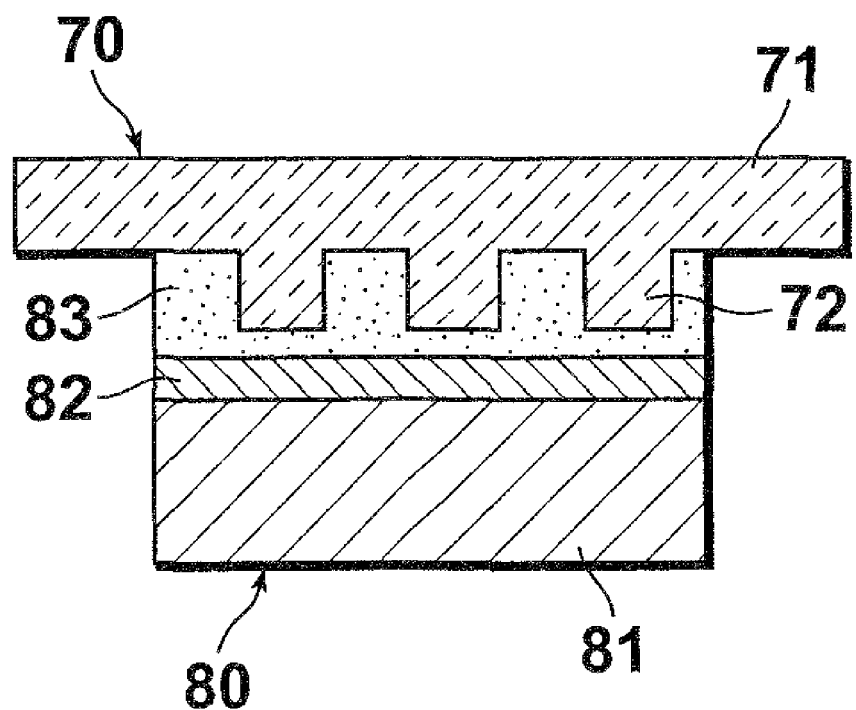

ELECTRON BEAM WRITING METHOD, FINE PATTERN WRITING SYSTEM, METHOD FOR MANUFACTURING UNEVEN PATTERN CARRYING SUBSTRATE, AND METHOD FOR MANUFACTURING MAGNETIC DISK MEDIUM

BACKGROUND OF THE INVENTION

1. Field of the Invention

The present invention relates to an electron bean writing method and a fine pattern writing system for writing a fine pattern according to a desired uneven pattern when manufacturing an imprint mold, magnetic transfer master substrate, or the like for a high density magnetic recording medium, such as a discrete track medium, bit pattern medium, or the like.

The present invention also relates to a method for manufacturing an uneven pattern carrying substrate that includes an imprint mold, magnetic transfer master substrate, or the like having an uneven pattern surface formed through a writing step performed by the electron beam writing method described above. The invention further relates to a method for manufacturing a magnetic disk medium having an uneven pattern transferred thereto from the uneven pattern carrying substrate or imprint mold, and a method for manufacturing a magnetic disk medium having a magnetized pattern transferred thereto from the magnetic transfer master substrate.

2. Description of the Related Art

Generally, information patterns, such as servo patterns and the like are formed on a current magnetic disk medium. In view of the demand of higher recording density, a discrete track medium (DTM) in which magnetic interference between adjacent data tracks is reduced by separating the tracks with a groove pattern (guard band) has been attracting wide attention. A bit pattern medium (BPM) proposed for achieving still higher density is a medium in which magnetic substances forming single magnetic domains (single-domain particles) are physically isolated and disposed regularly, and one bit is recorded in a single particle.

Heretofore, fine patterns, such as servo patterns and the like, have been formed on magnetic media by uneven patterns, magnetic patterns, or the like, and an electron beam writing methods for patterning a predetermined fine pattern on a master of a magnetic transfer master substrate or the like have been proposed. In the electron beam writing methods, a pattern is written on a substrate applied with a resist by irradiating thereon an electron beam corresponding to the shape of the pattern while rotating the substrate as described, for example, in U.S. Pat. No. 7,026,098 and Japanese Unexamined Patent Publication No. 2006-184924.

The electron beam writing method described in U.S. Pat. No. 7,026,098 is a method in which when, for example, writing a rectangular or parallelogram element constituting a servo pattern extending in the width direction of a track, the electron beam is deflected in a radius direction while being vibrated rapidly in circumferential directions to scan the beam so as to completely fill the area of the element.

The electron beam writing method described in Japanese Unexamined Patent Publication No. 2006-184924 is a method in which the electron beam is vibrated in the track width directions of the pattern.

Further, a method in which an electron beam is on/off irradiated on a substrate applied with a resist according to the shape of a pattern while the substrate is rotated, and the substrate or the electron beam irradiation device is moved by a single beam width in a radius direction per one revolution is also known as an on/off writing method.

In the writing methods described in U.S. Pat. No. 7,026,098 and Japanese Unexamined Patent Publication No. 2006-184924, patterns on one track are written by one revolution of the substrate by rapidly vibrating the electron beam in the circumferential directions or radius directions of the substrate, thereby reducing the time required for pattern writing over the entire surface of the substrate.

In the mean time, when writing fine patterns by the electron beam writing methods described above, it is difficult to accurately write elements which form each pattern over the entire tracks from the innermost circumferential track to the outermost circumferential track with a uniform amount (dose amount) of radiation exposure.

In particular, for those that vibrate the electron beam in the radius or circumferential directions, it is difficult write a pattern which includes elements having different lengths in the radius directions (track width directions) or circumferential directions (track directions) with a uniform amount of radiation exposure.

The reason is that the change in the beam intensity of the electron beam causes beam instability so that the beam intensity can not be changed during the writing of elements according to the shapes of the elements. Consequently, the writing is performed with an optimum amount of radiation exposure by equalizing the writing area per unit time to adjust to the sensitivity of the resist.

That is, the electron beam writing is a method in which a substrate is placed on a rotation stage and, while the substrate is rotated at a constant speed, an electron beam is scan controlled on the substrate, whereby elements on one track are sequentially written. For example, when writing a fine pattern of a discrete track medium, the writing can be performed over the entire surface of the substrate with a substantially uniform amount of radiation exposure for a servo pattern by controlling the rotational speed of the substrate so as to correspond to a change in the circumferential length of elements, since each of the elements of the servo pattern has a rectangular shape with substantially the same size. But, when writing the groove pattern for separating the adjacent track described above following the servo pattern, if the electron beam is fixedly irradiated to write the groove pattern in an arc shape by the rotation of the substrate, the electron beam intensity for the servo pattern writing is too intense for the groove writing since the groove pattern has a narrow width in the radius directions and continued in the track directions. Consequently, the line width becomes larger by exposure bleeding, thereby posing a problem that writing of a groove pattern having a predetermined width relative to the track width can not be performed. The emitted electron beam is subjected to deflection control so as to be vibrated, scanned to fill element areas, and moved between tracks. Such deflection control alone is insufficient for the flexibility in the change of radiation exposure amount and can not address the problem described above.

As described above, there is a demand for an electron beam writing method capable of highly accurately writing a fine pattern having a complicated shape both in an inner circumferential portion and an outer circumferential portion in response to the improvement of recording density of magnetic disk media.

The on/off writing method described above may write a pattern having a complicated shape by increasing the number of clocks in one rotation and improving positional accuracy. But, the method has a problem that it takes a lot of time to write a pattern over the entire substrate and it is difficult to perform pattern writing over the entire substrate by ensuring on/off positional accuracy of the electron beam according to the rotational position in inner and outer circumferences.

In view of the circumstances described above, it is an object of the present invention to provide an electron beam writing method capable of highly accurately writing a fine pattern having a complicated shape by further improving the flexibility to control the amount of radiation exposure in scan writing with an electron beam, and a fine pattern writing system for performing the electron beam writing method.

It is a further object of the present invention to provide a method for manufacturing an uneven pattern carrying substrate, such as an imprint mold or a magnetic transfer master substrate, having a fine pattern accurately written by an electron beam, and a method for manufacturing a magnetic disk medium having an uneven pattern or a magnetic pattern transferred thereto from the uneven pattern carrying substrate.

SUMMARY OF THE INVENTION

An electron beam writing method of the present invention is a method for writing a fine pattern on a substrate applied with a resist and placed on a rotation stage by scanning an electron beam on the substrate by an electron beam writing unit while rotating the rotation stage, the fine pattern being formed of elements, each having a track direction length greater than a radiation diameter of the electron beam, wherein the electron beam is X-Y deflectable in which the electron beam is shifted in a radius direction and a direction orthogonal to the radius direction of the rotation stage, and the electron beam is scan controlled so as to completely fill the shape of each of the elements by vibrating the electron beam rapidly in the radius direction of the rotation stage and at the same time deflecting in the direction orthogonal to the radius direction of the rotation stage faster than a rotational speed thereof while the substrate is rotated in one direction, thereby sequentially writing the elements.

At that time, it is preferable the deflection of the electron beam in the direction orthogonal to the radius direction of the rotation stage is opposite to a tangential rotational direction of the rotation stage at a writing position of the substrate and faster than a rotational speed in the tangential direction.

Preferably, the rotation stage is circumferentially divided into a plurality of regions, and an encoder pulse signal generated according to the rotational angle of the rotation stage at the starting point of each of the regions and a write control signal that scans the electron beam are synchronized.

Further, it is preferable that a writing length of each of the elements of the fine pattern in the radius direction is defined by amplitude of the reciprocal vibration of the electron beam.

Still further, it is preferable that the rotational speed of the substrate is controlled so as to become the same linear speed between writing on an outer circumferential region and writing on an inner circumferential region of the substrate.

Further, the deflection speed of the electron beam in the direction orthogonal to the radius direction of the rotation stage may be controlled so as to be fast in writing on an inner circumferential track and slow in writing on an outer circumferential track in inversely proportional to the radius of the writing position on the substrate.

Preferably, the timing of a write control signal that scans the electron beam is controlled based on a writing clock signal generated according to the rotation of the rotation stage and the length of the write control signal is an integer multiple of the writing clock signal.

Further, it is preferable that a write control signal of the electron beam is generated based on a writing lock signal generated in association with the rotation of the rotation stage and the number of clocks of the writing clock signal in one rotation of the rotation stage is maintained at a constant value for each track irrespective of the radius of the writing position.

A fine pattern writing system of the present invention is a system for realizing the electron beam writing method described above, including a signal output unit for outputting a write data signal, and the electron beam writing unit for scanning the electron beam.

Preferably, the fine pattern writing system is structured in the following manner. That is, the electron beam writing unit includes a rotation stage movable in a radius direction while rotating a substrate applied with a resist, an electron gun that emits an electron beam, a deflection means that X-Y deflects the electron beam in the radius direction of the rotation stage and a direction orthogonal to the radius direction and rapidly vibrates the electron beam in the direction orthogonal to the radius direction, a blanking means that blocks the radiation of the electron beam other than a writing portion, and a controller that performs associated control of operation of each of the means. The signal output unit is a unit that outputs a write data signal to the controller of the electron beam writing unit based on data corresponding to the shape of a fine pattern to be written on the substrate. Here, the controller controls operation of the deflection means and blanking means to scan control the electron beam so as to completely fill the shape of each of the elements by vibrating the electron beam rapidly in the radius direction of the rotation stage and at the same time deflecting in the direction orthogonal to the radius direction of the rotation stage faster than a rotational speed thereof while rotating the rotation stage in one direction, thereby sequentially writing the elements.

A method of manufacturing an uneven pattern carrying substrate is a method including the step of exposing a desired fine pattern on a substrate applied with a resist by the electron beam writing method as claimed in claim 1 and forming thereon an uneven pattern corresponding to the desired fine pattern. Here, the uneven pattern carrying substrate is a substrate having thereon a desired uneven pattern, such as an imprint mold for transferring the shape of the uneven pattern to a target medium, a magnetic transfer master substrate for transferring a magnetic pattern corresponding to the shape of the uneven pattern to a target medium, or the like.

A method of manufacturing a magnetic disk medium of the present invention is a method including the step of using an imprint mold obtained through a step of exposing a desired fine pattern on a substrate applied with a resist by the electron beam writing method as described above and forming thereon an uneven pattern corresponding to the desired fine pattern, thereby transferring an uneven pattern corresponding to the uneven pattern formed on the surface of the mold to the medium. More specifically, the magnetic disk medium includes a discrete track medium and a bit pattern medium.

Another method of manufacturing a magnetic disk medium of the present invention is a method including the step of using a magnetic transfer master substrate obtained through a step of exposing a desired fine pattern on a substrate applied with a resist by the electron beam writing method described above and forming thereon an uneven pattern corresponding to the desired fine pattern, thereby transferring a magnetic pattern corresponding to the uneven pattern formed on the surface of the master substrate to the medium.

According to the electron beam writing method of the present invention, an electron beam is scanned by an electron beam writing unit capable of X-Y deflecting the electron beam in which the electron beam is shifted in a radius direction and a direction orthogonal to the radius direction of the rotation stage while a substrate applied with a resist and placed on a rotation stage is rotated in one direction to write a fine pattern, which is constituted by elements having a track direction length greater than a radiation diameter of the electron beam, on the substrate. Here, the electron beam is scan controlled so as to completely fill the shape of each of the elements by vibrating the electron beam rapidly in the radius direction of the rotation stage and at the same time deflecting in the direction orthogonal to the radius direction of the rotation stage faster than a rotational speed thereof, thereby the elements are written sequentially. This increases the flexibility to control the amount of radiation exposure in scan writing with an electron beam, whereby a fine pattern having a complicated shape which is to be formed on a magnetic disk medium may be written over the entire surface of the substrate highly accurately. That is, the writing may be performed with a constant amount of radiation exposure over the entire surface of the substrate rapidly and accurately, whereby writing efficiency is improved and the writing time is reduced.

In particular, the electron beam is deflected in the direction orthogonal to the radius direction of the rotation stage faster than a rotational speed thereof, so that writing in the forward direction with respect to the rotation is possible. This provides a time allowance to appropriately control the amount of radiation exposure according to the element shape of the fine pattern. For example, for an element that requires more amount of radiation exposure, the scanning speed of the electron beam may be decreased, while a groove pattern of a discrete track medium that tends to be overexposed may be written with an appropriate amount of radiation exposure by writing the pattern in a small width with a greater deflection speed in the direction opposite to the rotational direction of the rotation stage.

Further, the flexibility in arranging elements of a fine pattern is increased, whereby, for example, a first element is written in the forward direction, then the electron beam is returned in the backward direction, and a second element overlapping in phase with the first element may be written. As such, a wide variety of patterns may be written. Still further, a time required for synchronization and alignment between the rotation of the rotation stage and writing is ensured, so that the writing accuracy is further improved.

In the mean time, the fine pattern writing system for realizing the electron beam writing method of the present invention includes a signal output unit for outputting a write data signal and an electron beam writing unit for scanning an electron beam, so that a desired fine pattern may be written rapidly and highly accurately, whereby writing efficiency is improved and the writing time is reduced.

In particular, a preferable system as the fine pattern writing system may be built in the following manner. That is, the electron beam writing unit includes a rotation stage movable in a radius direction while rotating a substrate applied with a resist, an electron gun that emits an electron beam, a deflection means that X-Y deflects the electron beam in the radius direction of the rotation stage and a direction orthogonal to the radius direction and rapidly vibrates the electron beam in the direction orthogonal to the radius direction, a blanking means that blocks the radiation of the electron beam other than a writing portion, and a controller that performs associated control of operation of each of the means. The signal output unit is a unit that outputs a write data signal to the controller of the electron beam writing unit based on data corresponding to the shape of a fine pattern to be written on the substrate. Here, the controller controls operation of the deflection means and blanking means to scan control the electron beam so as to completely fill the shape of each of the elements by vibrating the electron beam rapidly in the radius direction of the rotation stage and at the same time deflecting in the direction orthogonal to the radius direction of the rotation stage faster than a rotational speed thereof while rotating the rotation stage in one direction, thereby sequentially writing the elements.

According to the method for manufacturing an uneven pattern carrying substrate of the present invention, the method includes the step of exposing a desired fine pattern on a substrate applied with a resist by the electron beam writing method described above and forming an uneven pattern thereon corresponding to the desired fine pattern. Thus, a substrate having thereon a highly accurate uneven pattern may be obtained easily. Where the substrate is an imprint mold, in particular, the use of the mold in patterning using an imprint technology allows a magnetic disk medium having excellent properties, such as a discrete track medium or a bit pattern medium, to be manufactured easily in which the mold is pressed onto the surface of a resin layer to be used as a mask in the manufacturing process of the magnetic disk medium and the pattern is transferred to the surface of the medium at a time. Where the substrate is a magnetic transfer master substrate, the substrate has thereon a fine pattern of a magnetic layer which includes at least a servo pattern, so that the use of the master substrate allows a magnetic recording medium having excellent properties to be manufactured easily in which the master is brought into contact with the magnetic recording medium and a magnetic field is applied thereto using a magnetic transfer technology and a magnetic pattern corresponding to the pattern of the magnetic layer is transfer formed on the magnetic recording medium.

BRIEF DESCRIPTION OF THE DRAWINGS

FIG. 4A is an enlarged schematic view of a basic writing principle for writing elements constituting a fine pattern on inner circumferential tracks.

FIGS. 4B to 4G illustrate various signals, including a deflection signal and the like, used in the basic writing principle shown in FIG. 4A.

FIG. 7 is a schematic cross-sectional view illustrating a process of transfer forming a fine pattern using an imprint mold of the present invention having a fine pattern written by the electron beam writing method or fine pattern writing system.

DESCRIPTION OF THE PREFERRED EMBODIMENTS

Figure 1:
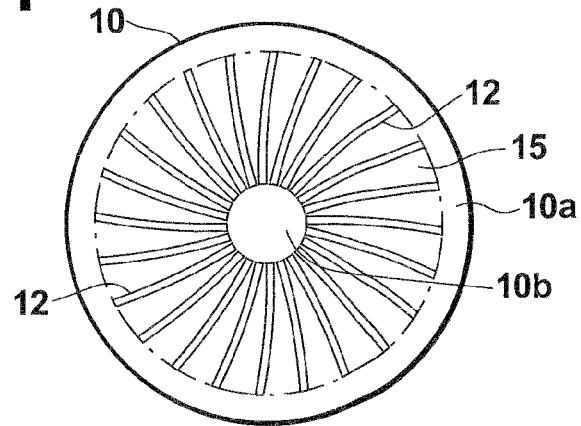
FIG. 1 illustrates an example fine pattern in plan view to be written on a substrate by an electron beam writing method of the present invention.
Figure 2:
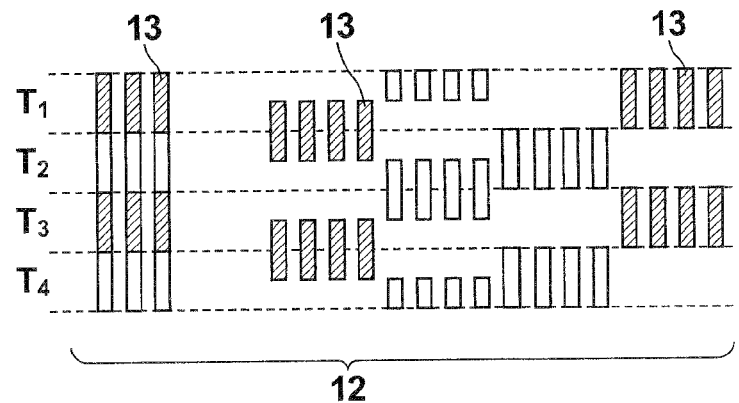
FIG. 2 is a partially enlarged view of the fine pattern.
Figure 3:
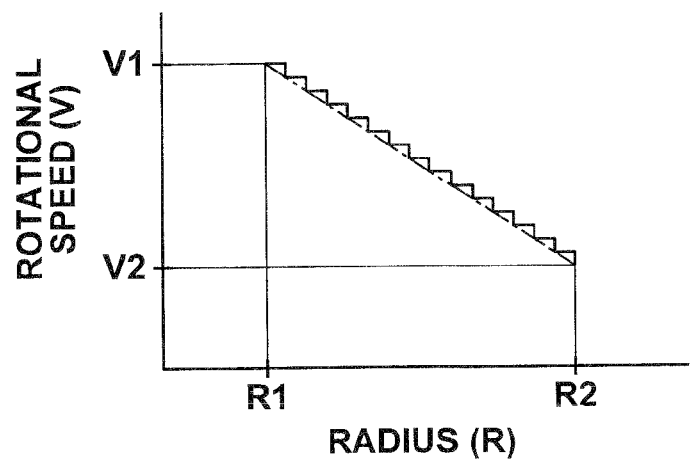
FIG. 3 is a characteristic view illustrating the relationship between writing radius position and substrate rotational speed.
Figure 5A:
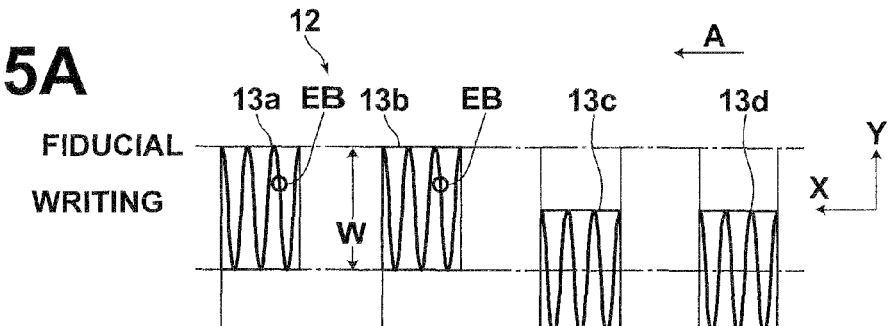
FIG. 5A is an enlarged schematic view of a basic writing principle for writing elements constituting a fine pattern on outer circumferential tracks.
Figure 5B:
FIGS. 5B to 5G illustrate various signals, including a deflection signal and the like, used in the basic writing principle shown in FIG. 5A.
Figure 5C:
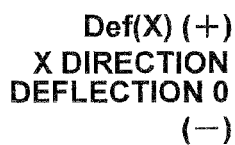
Figure 5D:
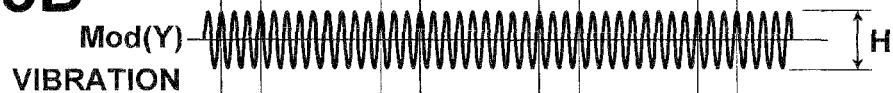
Figure 5E:
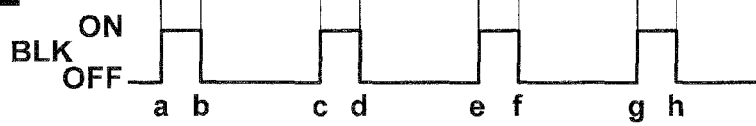
Figure 5F:
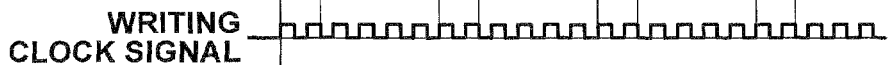
Figure 5G:
Figure 6A:
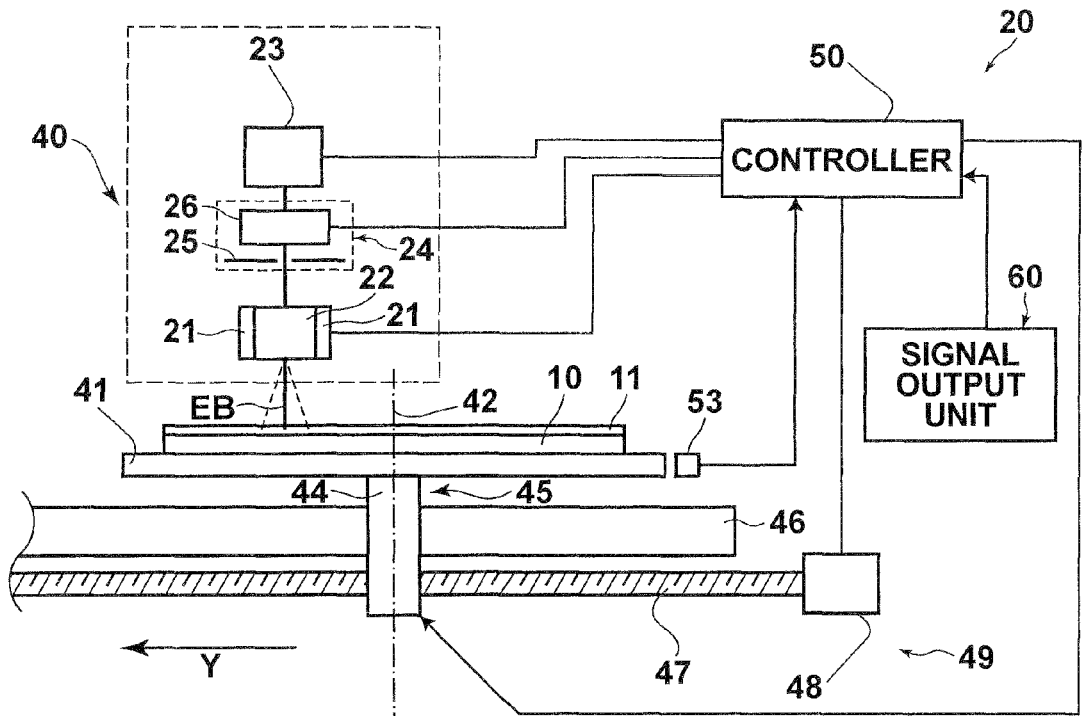
FIG. 6A is a relevant side elevational view of a fine pattern writing system according to an embodiment for implementing the electron beam writing method of the present invention.
Figure 6B:
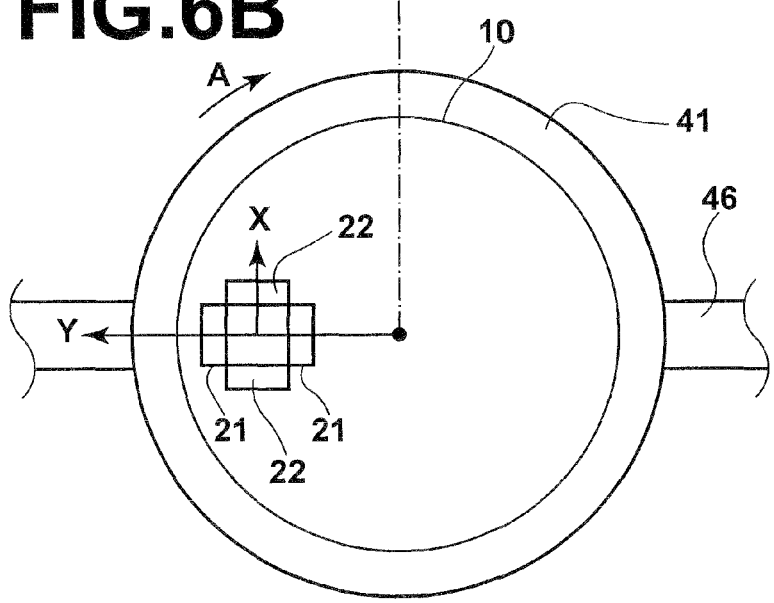
FIG. 6B is a partial plan view of the fine pattern writing system shown in FIG. 6A.

Hereinafter, exemplary embodiments of the present invention will be described in detail with reference to the accompanying drawings. FIG. 1 illustrates an example fine pattern in plan view to be written on a substrate by an electron beam writing method of the present invention. FIG. 2 is a partially enlarged view of the fine pattern. FIG. 3 is a graph illustrating the relationship between the writing radius position and substrate rotational speed. FIG. 4A is an enlarged schematic view of a basic writing principle for writing elements constituting a fine pattern on inner circumferential tracks, and FIGS. 4B to 4G illustrate various signals, including a deflection signal and the like, used in the basic writing principle shown in FIG. 4A. FIG. 5A is an enlarged schematic view of a basic writing principle for writing elements constituting an identical fine pattern to that shown in FIG. 4A on outer circumferential tracks, and FIGS. 5B to 5G illustrate various signals, including a deflection signal and the like, used in the basic writing principle shown in FIG. 5A. FIG. 6A is a relevant side elevational view of a fine pattern writing system according to an embodiment for implementing the electron beam writing method of the present invention, and FIG. 6B is a partial plan view of the fine pattern writing system shown in FIG. 6A.

As illustrated in FIGS. 1 and 2, the fine pattern of fine uneven shape for a magnetic disk medium includes servo patterns 12 formed in a plurality of servo areas, and data area 15 is provided between servo areas 12. The fine pattern is formed on an annular region of disk-shaped substrate 10 (circular substrate) excluding outer circumferential portion 10a and inner circumferential portion 10b.

Servo patterns 12 are formed in elongated areas substantially radially extending from the center to each sector on concentric tracks of substrate 10 at regular intervals. In this example, servo patterns 12 are formed in contiguous curved radials in radius directions. As shown in FIG. 2, which is a partially enlarged view of the servo patterns, fine rectangular servo elements 13 corresponding, for example, to preamble, address, and burst signals are disposed on concentric tracks T1 to T4. One servo element 13 has a width corresponding to one track width and a length in the track direction which is greater than an irradiation diameter of the electron beam. Some of servo elements 13 of the burst signal are shifted by a half track width so as to extend to an adjacent track.

One revolution of substrate 10 causes servo elements 13 for one track to be written. When first track T1 or third track T3 shown in FIG. 2 is written, hatched elements 13 are written serially. Servo elements 13 shifted by a half track width so as to extend to adjacent track T2 or T3 are written at a time by shifting the writing fiducial by a half track width without dividing them into halves.

For a discrete track medium, which has received attention in recent years, groove patterns extending in the track direction are concentrically formed in a guard band section between each data track in data areas 15 so as to separate each of adjacent tracks T1 to T4 by the grooves, in addition to servo patterns 12. The groove patterns are written by separate write control.

When writing each servo element 13 of servo patterns 12, substrate 10 applied with resist 11 is placed on rotation stage 41 (FIG. 6) to be described later, and while substrate 10 is rotated, elements 13 are sequentially scanned with electron beam EB to radiation expose resist 11 one track at a time from a track on the inner circumferential side to a track on the outer circumferential side or vice versa.

FIG. 3 illustrates the relationship between substrate rotational speeds (number of rotations) between writing on an inner circumferential track and writing on an outer circumferential track in pattern writing on substrate 10. In the basic characteristic represented by the chain line, rotation control is performed such that the rotational speed (number of rotations V2) of the outermost track (radius R2) is decreased in inversely proportional to the radius with respect to the rotational speed (number of rotations V1) of the innermost track (radius R1). In practice, the rotational speed is not change-controlled for each track, but the rotation control is performed in a stepwise manner when rotation stage 41 is mechanically moved in the radius direction after a plurality of tracks (e.g., 8 tracks) is written according to the deflectable range of electron beam EB in the radius direction to change the rotational speed of rotation stage 41 in association with the mechanical movement thereof, as shown by the solid line.

In this way, the rotational speed of rotation stage 41 is controlled so as to be decreased when writing on an outer circumferential track is performed and increased when writing on an inner circumferential track is performed in order to maintain the linear velocity constant over the entire writing area of substrate 10 including an inner side region and an outer side region when a writing region in the writing area of substrate 10 is moved in the radius direction, that is, when a track migration occurs. This is advantageous since a uniform amount of radiation exposure and writing position accuracy may be ensured in the writing with electron beam EB.

FIGS. 4A to 4G and FIGS. 5A to 5G illustrate an embodiment of the electron beam writing method of the present invention. In the present embodiment, the writing is sequentially performed from servo elements 13a, 13b of servo pattern 12 within a track to servo patterns 13c, 13d extending to an adjacent track at a time while substrate 10 (rotation stage 41) is rotated one revolution. That is, while rotating substrate 10 in "A" direction sequentially writing servo elements 13a to 13d at a time at predetermined phase positions on concentric tacks (track width: W) which, when viewed microscopically, extend linearly in circumferential directions X orthogonal to radius direction Y of substrate 10 by scanning with electron beam EB having a small diameter so as to completely fill the shapes thereof.

FIGS. 4A to 4G illustrate writing on an inner circumferential track, in which the track direction lengths of servo elements 13a to 13d are small, and FIGS. 5A to 5G illustrate writing on an outer circumferential track, in which the track direction lengths of servo elements 13a to 13d are increased as the circumferential length increases, although track width W is not changed. In both cases, signals read out from corresponding one of servo elements 13a to 13d are the same when rotationally driven as a finished product of magnetic disk medium.

The recording system of servo patterns 12 described above is a constant angular velocity (CAV) system, in which writing is performed such that the length of element 13 in the track direction is long on a track on the outer circumferential side and short on a track on the inner circumferential side according to the difference in the sector length between the inner and outer circumferences.

The scanning of electron beam EB is performed in the following manner. That is, while electron beam EB having a smaller beam diameter than a minimum track direction length of servo elements 13a to 13d is irradiated through on/off operations of blanking means 24, to be described later, according to the writing region, electron beam EB is X-Y deflected in radius direction Y and directions orthogonal to the radius direction (circumferential directions X) according to the rotational speed of substrate 10 (rotation stage 41) to vibrate the beam in radius direction Y orthogonal to circumferential directions X rapidly at a constant amplitude, whereby beam exposure writing is performed, as illustrated in FIGS. 4A and 5A. Following the writing of servo elements 13a, 13b within the track, the writing fiducial in the radius direction is shifted by a half track width, and servo elements 13c, 13d extending to an adjacent track are written in the same manner as described above.

Detailed description will be made based on FIGS. 4A to 4G and FIGS. 5A to 5G. FIGS. 4A, 5A illustrate writing operation of electron beam EB in radius direction Y (outer circumferential direction) and circumferential direction X (rotational direction). FIGS. 4B, 5B illustrate deflection signal Def(Y) for deflecting electron beam EB in radius direction Y, and FIGS. 4C, 5C illustrate deflection signal Def(X) for deflecting electron beam EB in circumferential direction X. FIGS. 4D, 5D illustrate vibration signal Mod (Y) for vibrating electron beam EB in radius direction Y. FIGS. 4E, 5E illustrate on/off operations of blanking signal BLK. FIGS. 4F, 5F illustrate a writing clock signal and FIGS. 4G, 5G illustrate a constant basic clock signal. Note that, the horizontal axis in FIGS. 4A, 5A represents rotation angle, and represents time in FIGS. 4B to 4G and FIGS. 5B to 5G.

The basic clock shown in FIGS. 4G, 5G is a constant clock signal, which does not change under any circumstances, generated in controller 50, to be described later. The writing clock signal shown in FIGS. 4F, 5F is based on the basic clock signal, and the clock width (clock length) is controlled according to a change in rotational speed V such that the number of clocks per revolution of rotation stage 41 remains the same even when the rotational speed of rotation stage 41 is changed between the time when an inner circumferential track is written and the time when an outer circumferential track is written as illustrated in FIG. 3.

That is, the clock width is changed according to radius R of each track so as to become narrow on an inner circumferential track shown in FIG. 4A and wide on an outer circumferential track shown in FIG. 5A. Then, the dimensional and temporal widths in circumferential direction X are defined by the number of clocks of the writing clock signal and each of servo elements 13a to 13d is written with the same number of clocks between FIGS. 4A to 4G and FIGS. 5A to 5G. This will result in that the numbers of writing clocks between the inner and outer circumferential sides at the same angle (phase) correspond to each other, whereby similar patterns may be written easily. Unlike the above, where the clock width is maintained the same between the inner and outer circumferences, the width of an element on a certain track may not possibly correspond to an integer multiple of the clock width, whereas, in the present invention, the element width is always maintained to an integer multiple of the clock width so that servo elements with subtly changing pattern widths may be written easily.

By way of an example, writing of servo elements 13 will now be described in detail with reference to FIGS. 4A to 4G and FIGS. 5A to 5G. First, at point "a", blanking signal BLK (FIGS. 4E, 5E) is turned ON to start writing of the servo element 13a by irradiating electron beam EB. While being vibrated in radius direction Y by vibration signal Mod (Y) (FIGS. 4D, 5D), electron beam EB is deflected by deflection signal Def (X) (FIGS. 4C, 5C) and moved in circumferential direction (−X) which is opposite to rotational direction "A", so as to completely fill a rectangular area of the servo element 13a. Then, at point "b", blanking signal BLK is turned OFF to terminate the irradiation of electron beam EB and writing of element 13a. After point "b", the deflection in circumferential direction X is returned to the fiducial position. Note that deflection signal Def(Y) (FIGS. 4B, 5B) is constant and electron beam EB is not deflected in radius direction Y, i.e., fixed.

The deflection in circumferential direction (−X) by deflection signal Def(X) is opposite to rotational direction "A" and greater in value than rotational speed "V". Further, it includes an amount of deflection in the same direction as direction "A" for compensating for a deviation of the irradiation position of electron beam EB arising from the rotation of substrate 10 in direction "A" during writing. This causes electron beam ED to move forward relative to the rotation of substrate 10, and writing of a predetermined length is completed at point "b" before the write end position of servo element 13a reaches the write start position. The frequency of vibration signal Mod (Y) (FIGS. 4D, 5D) is set such that electron beam EB is reciprocally moved according to the rotational speed of rotation stage 41 and deflection speed in circumferential direction (−X) at a predetermined interval which corresponds to the sensitivity of resist 11 and beam intensity with respect to the writing area of servo element 13a (FIGS. 4A, 5A) at the writing radius position of substrate 10. Note that, where the relative movement speed between electron beam EB and substrate 10 is set so as to be constant between outer and inner circumferential portions, the frequency of vibration signal Mod(Y) (FIGS. 4D, 5D) is set to a constant value if other compensation elements are not considered.

Next, when substrate 10 is rotated further and reaches point "c", the writing of next servo element 13b is initiated in the same manner as described above, and the writing of servo element 13b is performed based on the similar deflection signals, which is then terminated at point "d".

Thereafter, at point "e", the fiducial position of deflection signal Def (Y) is shifted by a half track width in radius direction (−Y). Then, while being vibrated in radius direction Y by vibration signal Mod (Y) (FIGS. 4B, 5B) from the shifted fiducial position, electron beam EB is deflected by deflection signal Def (X) (FIGS. 4C, 5C) and moved in circumferential direction (−X) which is opposite to rotational direction "A" in the same manner as described above. In this way, electron beam EB is scanned so as to completely fill a rectangular area of servo element 13c. Then, at point "f", blanking signal BLK is turned OFF to terminate the irradiation of electron beam EB and writing of element 13c. After point "f", the deflection in circumferential directions X is returned to the fiducial position.

Next, when substrate 10 is rotated further and reaches point "g", the writing of next servo element 13d is initiated in the same manner as described above, and writing of servo element 13d is performed based on the similar deflection signals, which is then terminated at point "h".

As described above, the writing deflection control signals shown in FIGS. 4B to 4D or 5B to 5D are generated based on the writing clock signal shown in FIG. 4F or 5F, and the on/off operations of the blanking signal shown in FIG. 4E or 5E are performed according to the clock generation timing of the writing clock signal.

Note that when writing servo elements 13, accurate positioning is performed at a plurality of write starting points, such as point "a" in FIG. 4E and the like, based on the encoder pulse signal to improve accuracy of the positions of servo patterns in one rotation. In particular, rotation stage 41 is circumferentially divided into a plurality of regions, and an encoder pulse signal generated at the starting point of each of the regions according to the rotational angle of rotation stage 41 and write control signals (FIGS. 4B to 4E, or FIGS. 5B to 5E), i.e., writing clock signal (FIG. 4F or 5F) are synchronized at the starting point of each region.

After writing on one track for one rotation is completed, electron beam EB is moved to the next track and writing is performed in the same manner as described above, whereby desired fine patterns 12 are written over the entire writing area of substrate 10. The track migration of electron beam EB is performed by linearly moving rotation stage 41, to be described later, in radius direction Y. As described above, the movement of the rotation stage may be performed for writing of every plurality of tracks according to the deflectable range (including a vibrated range) of electron beam EB in radius direction Y or for writing of each track.

Deflection signal Def (X) for deflecting electron beam EB in circumferential direction X allows writing of any parallelogram element, as well as compensating for a writing point deviation arising from the rotation of rotation stage 41.

Comparison of the outer circumferential track writing shown in FIGS. 5A to 5G with the inner circumferential track writing shown in FIGS. 4A to 4G shows that each of the signals of FIGS. 5B, 5C, 5E and 5F is set such that the track direction length becomes longer at a predetermined multiplication rate. Amplitudes H of vibration signals Mod(Y) shown in FIGS. 4D and 5D are the same, since track width W is the same between inner and outer circumferential portions. The amplitude of the reciprocal vibration of electron beam in radius direction Y defines the writing length of servo element 13 in radius direction Y. Further, as described above, where the relative movement speed between electron beam EB and substrate 10 is set so as to be constant between outer and inner circumferential portions, the frequency of vibration signal Mod(Y) is set to a constant value. The shift amount of the deflection in circumferential direction X is set to a large value as the length of servo element 13 in the track direction becomes large on an outer circumferential side track.

In the mean time, the basic clock signal shown in FIG. 4G or 5G is generated at constant time intervals, and the clock width of the writing clock signal shown in FIG. 4F or 5F is controlled, based on the basic clock signal, such that each track has the same number of clocks according to the radius of writing position. That is, the clock width is increased by a similar multiplication rate to that of the signals of FIGS. 5B to 5F 4B, 4C, and 4E or FIGS. 5B, 5C, and 5E. Then, on/off operations of each of the control signals and signal shapes are set by counting the number of clocks of the writing clock signal. For example, servo elements 13 of servo pattern 12 are preferably written at a clock number in the range from 10 to 30 clocks.

As described above, the clock width of the writing clock signal becomes wide in an outer circumferential track and narrow in an inner circumferential track while rotational speed V of rotation stage 41 becomes slower in an outer circumferential track and faster in an inner circumferential track, which are changed at the same time in synchronization with each other. A slight change in the writing track position, that is, radius position during the same rotational speed V does not change the number of clocks in one rotation, so that elements having substantially the same shape may be written at the same phase position through control by the same number of writing clocks. Here, the relative moving speed of resist 11 with respect to electron beam EB differs depending on the radius position and becomes slightly faster in an outer circumference, whereby the amount of radiation exposure is changed. But, the signal widths of the written elements depend on the amplitude of the oscillation signal shown in FIG. 4D or 5D, so that they become substantially the same, and slight change in the writing track position may be compensated for by the sensitivity of the resist, signal accuracy and the like without changing rotational speed V and the width of the writing clock signal. Therefore, these signals can be actually used as recorded information without any problem and it is not necessary to perform change control of the rotational speed and writing clock width for writing of each track but, for example, for writing of every 8 tracks as described above.

The intensity of electron beam EB is set to a value which is sufficient to expose servo elements 13 by the rapid vibration writing. That is, the writing width (real exposure width) by electron beam EB is likely to become wider that the irradiation beam diameter and amplitude depending on the irradiation time and amplitude. As such, in order to write an element having a desired final width, it is necessary to perform scanning with an amount of radiation exposure yielding the desired writing width which is defined by controlling the amplitude and deflection speed. Note that it is difficult to change beam intensity in the middle of writing from the viewpoint of beam stability.

Instead of controlling rotation stage 41 based on the characteristic shown in FIG. 3, a uniform amount of radiation exposure may be obtained by controlling the deflection speed in circumferential direction X while drive controlling the rotation stage 41 at the same rotational speed between writing on an inner circumference and writing on an outer circumference.

That is, when writing on an inner circumference track, the deflection speed in circumferential direction (−X) is decreased, and when writing on an outer circumference track, the rotational speed of substrate 10 is increased so that the deflection speed in circumferential direction (−X) is increased by that much, whereby the relative speed with respect to the surface of substrate 10 is controlled constant. This allows electron beam writing over the entire surface of substrate 10 to be performed with a uniform amount of radiation exposure.

Following the writing of each element 13 of the servo pattern 12 described above, for example, a groove pattern of a discrete track medium is written in the following manner. The groove pattern having a small width and extending between adjacent data tracks is written at a predetermined length in the forward direction with respect to the rotation by deflecting deflection signal Def(X) in circumferential direction X at a high deflection speed. At this time, the writing is performed by reducing the amplitude of vibration, signal Mod(Y) in radius direction Y according to the element width or by stopping the vibration.

As described above, electron beam EB is scanned in order to write each element 13 of servo pattern 12. For performing the scanning control of electron beam EB, a write data signal is sent from signal output unit 60 (FIG. 6) to controller 50 of electron beam writing unit 40, which will be described later. The timing and phase of the write data signal are controlled based on an encoder pulse generated according to the rotation of rotation stage 41 and the writing clock signal.

In order to perform the writing described above, fine pattern writing system 20 shown in FIG. 6 is used. Fine pattern writing system 20 includes electron beam writing unit 40 and signal output unit 60. Electron beam writing unit 40 includes rotation stage unit 45 having rotation stage 41 and spindle motor 44 having a motor axis aligned with central axis 42 of rotation stage 41; shaft 46 passing through a portion of rotation stage unit 45 and extending in radius direction Y of rotation stage 41; and linear moving means 49 for moving rotation stage unit 45 along shaft 46. Rod 47 with accurate threading and disposed parallel to shaft 46 is screwed to a portion of rotation stage unit 45. Rod 47 is rotatable in the forward and reverse directions by pulse motor 48, and linear moving means 49 of rotation stage unit 45 is formed by rod 47 and pulse motor 48. Further, encoder 53 is installed for detecting the rotation of rotation stage 41. Encoder 53 generates an encoder pulse at regular intervals of a predetermined rotation phase by reading through the encoder slit, and the encoder pulse signal is sent to controller 50. Note that controller 50 also includes a clock means (not shown) therein that generates the basic clock signal in the timing control.

Electron beam writing unit 40 further includes electron gun 23 that emits electron beam EB, deflection means 21, 22 that deflect rapidly vibrating electron beam in radius direction Y at a constant amplitude, as well as deflecting the beam in radius direction Y and circumferential direction X, and, as blanking means 24 for turning the irradiation of electron beam EB ON and OFF, aperture 25 and blanking 26 (deflector). Electron beam EB emitted from electron gun 23 is irradiated on substrate 10 through deflection means 21, 22, a not shown lens, and the like.

Aperture 25 of blanking means 24 has a through hole for passing electron beam EB in the center, and blanking 26 operates according to input of ON/OFF signals, in which it passes electron beam EB through the through hole of aperture 25 during ON-signal without deflecting the beam, while it blocks electron beam EB with aperture 25 by deflecting the beam so as not to be passed through the through hole during OFF-signal, so that electron beam EB is not irradiated. Then, while each element 13 is being written, ON-signal is inputted to irradiate electron beam EB, and OFF-signal is inputted during a migration period between elements 13 to block electron beam EB so that exposure is not performed.

Control of the driving of spindle motor 44, that is, the rotational speed of rotation stage 41, driving of the pulse motor, that is, the linear movement of linear moving means 49, modulation of electron beam EB, deflection means 21, 22, ON/OFF operation of blanking 26 of blanking means 24, and the like is performed based on control signals outputted from controller 50 serving as the control means.

Signal output unit 60 stores writing data of a fine pattern, such as servo patterns 12 and sends a write data signal to controller 50. Controller 50 performs the associated control described above based on the write data signal, and electron beam writing unit 40 writes fine servo patterns 12 over the entire surface of substrate 10.

Substrate 10 to be placed on rotation stage 41 is made of, for example, silicon, glass, or quartz and a positive or negative electron beam writing resist 11 is applied on a surface thereof in advance. Preferably, the power and beam diameter are controlled taking into account the sensitivity of electron beam writing resist 11 and the shape of each element 13.

FIG. 7 is a schematic cross-sectional view illustrating a process of transfer forming a fine pattern using imprint mold 70 (uneven pattern carrying substrate) of the present invention having a fine pattern written by the electron beam writing method using fine pattern writing system 20.

Imprint mold 70 is obtained in the following manner. That is, resist 11 (not shown in FIG. 7) is applied on a surface of substrate 71 made of a transparent material and servo patterns 12 are written thereon. Thereafter, resist 11 is processed to form an uneven pattern of the resist. Substrate 71 is etched with the patterned resist as the mask, and then the resist is removed, whereby imprint mold 70 having fine uneven pattern 72 formed thereon is obtained. As an example, fine uneven pattern 72 includes a servo pattern for a discrete track medium and a groove pattern.

Magnetic disk medium 80 of the present invention is formed by imprint method using imprint mold 70. Magnetic disk medium 80 includes substrate 81 on which magnetic layer 82 and resist resin layer 83 for forming a mask layer are stacked in this order. The uneven shape of fine uneven pattern 72 is transfer formed by pressing fine uneven pattern 72 of imprint mold 70 against resist resin layer 83 and solidifying resist resin layer 83 by ultraviolet radiation. Thereafter, magnetic layer 82 is etched based on the uneven shape of resist resin layer 83 to form magnetic disk medium 80 of discrete track medium with the fine uneven pattern formed on magnetic layer 82.

The above description is a manufacturing process of a discrete track medium, but a bit pattern medium may also be manufactured through a similar process.

Figure 8A:
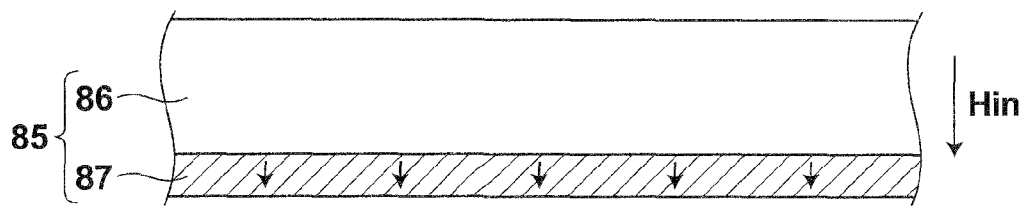
FIGS. 8A to 8C are schematic cross-sectional views illustrating a process of transferring and forming a fine pattern using a magnetic transfer master of the present invention having a fine pattern written by the electron beam writing method or fine pattern writing system.
Figure 8B:
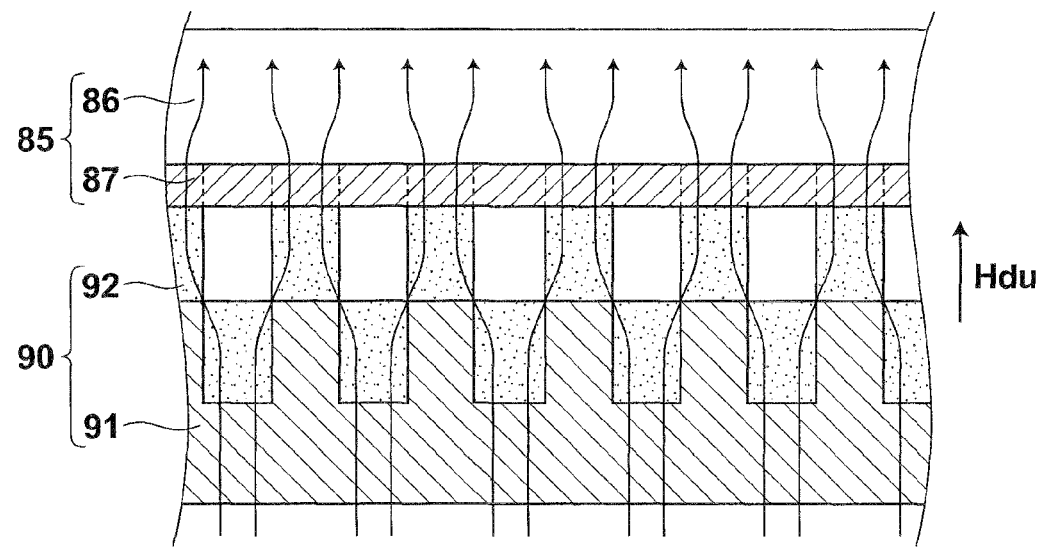
Figure 8C:
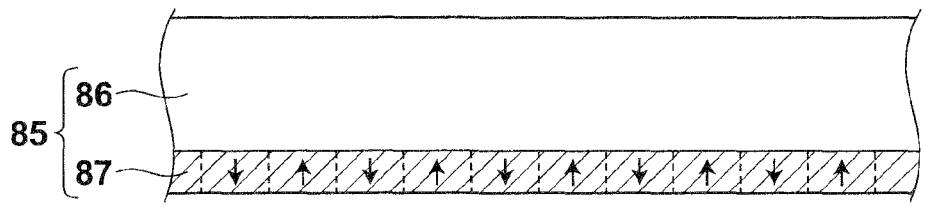

FIGS. 8A to 8C are schematic cross-sectional views illustrating a process of magnetic transfer of a magnetized pattern to magnetic disk medium 85 of the present invention using magnetic transfer master substrate 90 (uneven pattern carrying substrate) of the present invention having a fine pattern written by the electron beam writing method using fine pattern writing system 20.

The process of manufacturing magnetic transfer master substrate 90 is substantially identical to that of imprint mold 70. Substrate 10 to be placed on rotation stage 41 is made of, for example, a silicon, glass, or quartz disk, and positive or negative electron beam writing resist 11 is applied thereon. Then resist 11 is scanned with an electron beam to write a desired pattern thereon. Thereafter, resist 11 is processed to obtain substrate 10 having an uneven pattern of the resist, which is an original master of magnetic transfer master substrate 90.

Next, a thin conductive layer is formed on the surface of the uneven pattern formed on the surface of the original master, and electroforming is performed thereon to obtain substrate 91 having an uneven pattern of metal casting. Thereafter, substrate 91 having a predetermined thickness is peeled off from the original master. The uneven pattern on the surface of substrate 91 is a reverse pattern of the uneven shape of the original master.

After grinding the rear surface of substrate 91, magnetic layer 92 (soft magnetic layer) is stacked on the uneven pattern to obtain magnetic transfer master substrate 90. The shape of a convex portion or concave portion of the uneven pattern on the surface of substrate 91 depends on the uneven pattern of the resist of the original master.

A magnetic transfer method using magnetic transfer master substrate 90 manufactured in the manner as described above will be described. Magnetic disk medium 85 which is a medium to which information is transferred is, for example, a hard disk, flexible disk, or the like which includes substrate 86 having magnetic recording layer 87 formed on either one of the sides or on both sides. Here, it is assumed to be a vertical magnetic recording medium in which the easy direction of magnetization of magnetic recording layer 87 is perpendicular to the recording surface.

As illustrated in FIG. 8A, initial DC field Hin is applied to magnetic disk medium 85 in a direction perpendicular to the track surface in advance to initially DC-magnetize magnetic recording layer 87. Thereafter, as illustrated in FIG. 8B, magnetic transfer is performed by bringing the surface of magnetic disk medium 85 on the side of recoding layer 87 into close contact with the surface of master substrate 90 on the side of magnetic layer 92 and applying transfer field Hdu in a direction perpendicular to the track surface of magnetic disk medium 85 and opposite to the direction of initial DC field Hin. As the result, the transfer field is drawn into magnetic layer 92 of master substrate 90 and the magnetization of magnetic layer 87 of magnetic recording medium 85 at the portions corresponding to the convex portions of magnetic layer 92 of master substrate 90 is reversed, while the magnetization of the other portions is not reversed, as illustrated in FIG. 8C. Consequently, information (e.g., servo signal) corresponding to the uneven pattern of master substrate 90 is magnetically transfer recorded on magnetic recording layer 87 of magnetic disk medium 85. Note that, when performing magnetic transfer also to the upper side recording layer, the magnetic transfer is performed at the same time with the magnetic transfer of the lower side recording layer by bringing the upper side recording layer and an upper side master substrate into close contact with each other.

In the case of magnetic transfer to a longitudinal magnetic recording medium, master substrate 90 which is substantially the same as that used for the vertical magnetic recording medium is used. For the longitudinal recording medium, the magnetic disk medium is DC-magnetized in a direction along the track in advance. Then magnetic transfer is performed by bringing the magnetic disk medium into close contact with the master substrate and applying a transfer field in the direction opposite to that of the initial DC magnetization. The transfer field is drawn into convex portions of the magnetic layer of the master substrate 90 resulting in that the magnetization of the portions of the magnetic layer of the magnetic disk medium corresponding to the convex portions is not reversed while the magnetization of the other portions is reversed. In this way, a magnetized pattern corresponding to the uneven pattern may be recorded on magnetic disk medium 85.

The above manufacturing method of the imprint mold or magnetic transfer master substrate using the electron beam writing method of the present invention is illustrative only. The method is not limited to this and any method may be used as long as it has a process of writing a fine pattern to form an uneven pattern using the electron beam writing method of the present invention.

What is claimed is:

1. An electron beam writing method for writing a fine pattern on a substrate applied with a resist and placed on a rotation stage by scanning an electron beam on the substrate by an electron beam writing unit while rotating the rotation stage, the fine pattern being formed of elements, each having a track direction length greater than a radiation diameter of the electron beam,
   wherein the electron beam is X-Y deflectable in which the electron beam is shifted in a radius direction and a direction orthogonal to the radius direction of the rotation stage, and the electron beam is scan controlled so as to completely fill the shape of each of the elements by vibrating the electron beam rapidly in the radius direction of the rotation stage and at the same time deflecting in the direction orthogonal to the radius direction of the rotation stage faster than a rotational speed thereof while the substrate is rotated in one direction, thereby sequentially writing the elements.

2. The electron beam writing method as claimed in claim 1, wherein the deflection of the electron beam in the direction orthogonal to the radius direction of the rotation stage is opposite to a tangential rotational direction of the rotation stage at a writing position of the substrate and faster than a rotational speed in the tangential direction.

3. The electron beam writing method as claimed in claim 1, wherein the rotation stage is circumferentially divided into a plurality of regions, and an encoder pulse signal generated according to the rotational angle of the rotation stage at the starting point of each of the regions and a write control signal that scans the electron beam are synchronized.

4. The electron beam writing method as claimed in claim 1, wherein a writing length of each of the elements of the fine pattern in the radius direction is defined by amplitude of the reciprocal vibration of the electron beam.

5. The electron beam writing method as claimed in claim 1, wherein the rotational speed of the substrate is controlled so as to become the same linear speed between writing on an outer circumferential region and writing on an inner circumferential region of the substrate.

6. The electron beam writing method as claimed in claim 1, wherein the deflection speed of the electron beam in the direction orthogonal to the radius direction of the rotation stage is controlled so as to be fast in writing on an inner circumferential track and slow in writing on an outer circumferential track in inversely proportional to the radius of the writing position on the substrate.

7. The electron beam writing method as claimed in claim 1, wherein the timing of a write control signal that scans the electron beam is controlled based on a writing clock signal generated according to the rotation of the rotation stage and the length of the write control signal is an integer multiple of the writing clock signal.

8. The electron beam writing method as claimed in claim 1, wherein a write control signal of the electron beam is generated based on a writing lock signal generated in association with the rotation of the rotation stage and the number of clocks of the writing clock signal in one rotation of the rotation stage is maintained at a constant value for each track irrespective of the radius of the writing position.

9. A fine pattern writing system for realizing the electron beam writing method as claimed in claim 1, comprising:
   a signal output unit for outputting a write data signal; and
   the electron beam writing unit for scanning the electron beam.

10. The fine pattern writing system as claimed in claim 9, wherein the electron beam writing unit includes a rotation stage movable in a radius direction while rotating a substrate applied with a resist, an electron gun that emits an electron beam, a deflection means that X-Y deflects the electron beam in the radius direction of the rotation stage and a direction orthogonal to the radius direction and rapidly vibrates the electron beam in the direction orthogonal to the radius direction, a blanking means that blocks the radiation of the electron beam other than a writing portion, and a controller that performs associated control of operation of each of the means,
   wherein the signal output unit is a unit that outputs a write data signal to the controller of the electron beam writing unit based on data corresponding to the shape of a fine pattern to be written on the substrate, and
   wherein the controller controls operation of the deflection means and blanking means to scan control the electron beam so as to completely fill the shape of each of the elements by vibrating the electron beam rapidly in the radius direction of the rotation stage and at the same time deflecting in the direction orthogonal to the radius direction of the rotation stage faster than a rotational speed thereof while rotating the rotation stage in one direction, thereby sequentially writing the elements.

11. A method of manufacturing an uneven pattern carrying substrate comprising the step of:
   exposing a desired fine pattern on a substrate applied with a resist by the electron beam writing method as claimed in claim 1 and forming thereon an uneven pattern corresponding to the desired fine pattern.

12. A method of manufacturing a magnetic disk medium, comprising the step of:

using an imprint mold obtained through a step of exposing a desired fine pattern on a substrate applied with a resist by the electron beam writing method as claimed in claim 1 and forming thereon an uneven pattern corresponding to the desired fine pattern, thereby transferring an uneven pattern corresponding to the uneven pattern formed on the surface of the mold to the medium.

13. A method of manufacturing a magnetic disk medium, comprising the step of:

using a magnetic transfer master substrate obtained through a step of exposing a desired fine pattern on a substrate applied with a resist by the electron beam writing method as claimed in claim 1 and forming thereon an uneven pattern corresponding to the desired fine pattern, thereby transferring a magnetic pattern corresponding to the uneven pattern formed on the surface of the master substrate to the medium.

14. An electron beam writing method for writing a fine pattern on a substrate, the substrate applied with a resist and placed on a rotation stage, the method comprising:

scanning an electron beam on the substrate by an electron beam writing unit while rotating the rotation stage, the fine pattern being formed of elements that each have a track direction length greater than a radiation diameter of the electron beam, wherein the electron beam is X-Y deflectable such that the electron beam shifts in a radius direction and a direction orthogonal to the radius direction of the rotation stage, and wherein the electron beam is controlled to vibrate rapidly in the radius direction of the rotation stage, and at the same time is deflected in the direction orthogonal to the radius direction of the rotation stage faster than a rotational speed thereof while the substrate is rotated in one direction, thereby sequentially writing the elements such that a shape of each of the elements is completely filled.

* * * * *